United States Patent [19]

Tsukiji

[11] Patent Number: 5,650,649
[45] Date of Patent: Jul. 22, 1997

[54] FLOATING GATE TYPE FIELD EFFECT TRANSISTOR HAVING CONTROL GATE APPLIED WITH PULSES FOR EVACUATING CARRIERS FROM P-TYPE SEMICONDUCTOR FLOATING GATE

[75] Inventor: Masaru Tsukiji, Tokyo, Japan

[73] Assignee: NEC Corporation, Japan

[21] Appl. No.: 650,049

[22] Filed: May 16, 1996

Related U.S. Application Data

[63] Continuation of Ser. No. 354,286, Dec. 12, 1994, abandoned.

[30] Foreign Application Priority Data

Dec. 14, 1993 [JP] Japan .................. 5-313091

[51] Int. Cl.$^6$ .................. H01L 29/788
[52] U.S. Cl. .................. 257/316; 257/320
[58] Field of Search .................. 257/315, 316, 257/317, 318, 319, 320, 321, 322, 323

[56] References Cited

U.S. PATENT DOCUMENTS

| 4,200,841 | 4/1980 | Nagata et al. ............... 257/316 |
| 4,608,585 | 8/1986 | Keshtbod .................... 257/321 |
| 5,168,465 | 12/1992 | Harai ....................... 257/320 |
| 5,260,593 | 11/1993 | Lee ......................... 257/316 |
| 5,301,150 | 4/1994 | Sullivan et al. .          |
| 5,414,693 | 5/1995 | Ma et al. ................... 257/316 |

FOREIGN PATENT DOCUMENTS 63-93158  4/1988  Japan ............... H01L 29/78

OTHER PUBLICATIONS

Mukherjee et al; "a single transistor EEPROM Cell . . . "; IEDM 1985; pp. 616–619 1985.

*Primary Examiner*—Wael Fahmy
*Attorney, Agent, or Firm*—Hayes, Soloway, Hennessey, Grossman & Hage, P.C.

[57] ABSTRACT

A floating gate type field effect transistor has a floating gate electrode formed of p-type polysilicon and a control gate electrode capacitively coupled to the floating gate electrode, and an erasing pulse signal is applied to the control gate electrode so that accumulated electrons are drifted in a depletion layer formed in the floating gate electrode toward a lower insulating layer, thereby evacuating the electrons to a silicon substrate without deterioration of the lower insulating layer.

14 Claims, 10 Drawing Sheets

FLOATING GATE TYPE FIELD EFFECT TRANSISTOR HAVING CONTROL GATE APPLIED WITH PULSES FOR EVACUATING CARRIERS FROM P-TYPE SEMICONDUCTOR FLOATING GATE

This is a continuation of application Ser. No. 08/354,286 filed on Dec. 12, 1994 now abandoned.

FIELD OF THE INVENTION

This invention relates to a floating gate type field effect transistor and, more particularly, to a floating gate type field effect transistor having a control gate applied with pulses for evacuating carriers from a floating gate electrode.

DESCRIPTION OF THE RELATED ART

A standard floating gate type field effect transistor has a source region and a drain region spaced from one another by a channel region formed in a surface portion of a semiconductor substrate and a gate structure provided on the channel region, and the gate structure is implemented by a first gate oxide film, a floating gate electrode, a second gate oxide film and a control gate electrode. The floating gate type field effect transistor changes the threshold level depending upon the amount of electric charge accumulated in the floating gate electrode, and is available for a memory cell of a non-volatile semiconductor memory device such as an electrically programmable read only memory device or a flush write memory device. In the memory cell, the high and low threshold levels are corresponding to the two logic levels, and a data bit is written into the memory cell by injecting and evacuating electrons into the floating gate electrode.

A typical example of the floating gate type field effect transistor is disclosed by Satyen Mukherjee et al. in "A SINGLE TRANSISTOR EEPROM CELL AND ITS IMPLEMENTATION IN A 512K CMOS EEPROM", Technical Digest of IEDM, 1985, pages 616 to 619, and FIG. 1 illustrates the prior art floating gate type field effect transistor. The prior art floating gate type field effect transistor is fabricated on a p-type silicon substrate 1, and a thick field oxide layer 2 is selectively grown for defining an active area. Beneath the thick field oxide layer 2 is formed a heavily-doped p-type channel stopper 3 which isolates the floating gate type field effect transistor from adjacent circuit components.

An n-type source region 4a and an n-type drain region 4b are formed in the active area, and are spaced by a channel region 4c. A gate structure 5 is provided on the channel region 4c, and is implemented by a lamination of a lower gate oxide film 5a, a floating gate electrode 5b, an upper gate oxide film 5c and a control gate electrode 5d. The floating gate electrode is formed of n-type polysilicon doped with phosphorous.

If hot electrons are injected into the floating gate electrode 5b, the prior art floating gate type field effect transistor enters into write-in state. On the other hand, if the accumulated electrons are evacuated from the floating gate electrode 5b, the prior art floating gate type field effect transistor enters into erased state. Thus, the write-in state and the erased state are usually featured by a large amount of accumulated electrons and a small amount of accumulated electrons, and the following description is made in accordance with the usual relation between the state and the amount of accumulated electrons. However, the relation is opposite to the above in some papers.

When the accumulated electrons are evacuated from the floating gate electrode 5b, large negative bias voltage is applied between the control gate electrode 5d and the p-type silicon substrate 1, and the accumulated electrons are evacuated from the floating gate electrode 5b to the p-type silicon substrate 1 as Fowler-Nordheim tunneling current due to high electric field created in the lower gate oxide film 5a. The high electric field of the order of 15 MV/cm is required for the Fowler-Nordheim tunneling process, and a pulse signal PL is repeatedly applied to the control gate 5d for the Fowler-Nordheim tunneling. If the prior art floating gate type field effect transistor forms a part of the memory cell array of the flush write memory, the pulse signal changes the voltage level as shown in FIG. 2, and the amount of the tunneling current is dependent on the pulse height and the pulse width. In this instance, the negative bias is applied between the control gate electrode 5d and the p-type silicon substrate 1. However, the negative bias may be applied between the control gate electrode 5d and the source region 4a so as to evacuate the accumulated electrons from the floating gate electrode 5a to the source region 4a.

However, the high electric field created by the negative bias between the control gate electrode 5d and the p-type silicon substrate 1 deteriorates the lower gate oxide film 5a, and a large number of trapping centers take place therein. As described hereinbefore, the floating gate type field effect transistors are changed between the write-in state and the erased state, and electrons pass through the lower gate oxide film 5a during the write-in operation and the erasing operation. Then, the electrons are trapped by the trapping centers, and the lower gate oxide film 5a is gradually charged. The charged lower gate oxide film 5a affects the threshold, and finally makes the floating gate type field effect transistor disabled.

In order to prevent the lower gate oxide film 5a from the high electric field for the Fowler-Nordheim tunneling, a solution is proposed in Japanese Patent Publication of Unexamined Application No. 63-93158, and the proposed floating gate type field effect transistor is illustrated in FIGS. 3 and 4 of the drawings.

The prior art floating gate type field effect transistor disclosed in the Japanese Patent Publication is fabricated on a silicon substrate 21, and a thick field oxide layer 22 is selectively grown so as to define an active area. N-type source and drain regions 21a and 21b are formed in the silicon substrate 21, and are spaced from each other by a channel region 21c. A gate structure 23 is provided on the channel region 21c, and has a floating gate electrode 23a, a first control gate electrode 23b, a second control gate electrode 23c and an insulator 23d isolating these electrodes 23a to 23c from one another. The floating gate electrode 23a is formed of polysilicon partially doped with n-type dopant impurity and partially doped with p-type dopant impurity 23f, and the n-type section 23e and the p-type section 23f form a p-n junction 23g in the floating gate electrode 23a.

The second prior art floating gate type field effect transistor is changed to the write-in state through the similar manner to the first prior art floating gate type field effect transistor shown in FIG. 1.

In the erasing operation, the p-n junction 23g is reversely biased by controlling the first control gate electrode 23b capacitively coupled to the n-type section 23e and the second control gate electrode 23c also capacitively coupled to the p-type section 23f. Avalanche breakdown takes place at the reversely biased p-n junction 23g, and generates electron-hole pairs. The electrons are partially evacuated to the first control gate electrode 23b, and the holes are left in the floating gate electrode 23a, thereby extinguishing the accumulated electrons. As a result, the erasing does not deteriorate the insulator 23d between the floating gate electrode 23a and the silicon substrate 21.

Thus, the second prior art floating gate type field effect transistor is free from the deterioration of the insulator 23d beneath the floating gate electrode 23a. However, the second prior art floating gate type field effect transistor encounters a problem in a complex structure due to the second control gate electrode 23c and the p-n junction 23g formed in the floating gate electrode 23a.

SUMMARY OF THE INVENTION

It is therefore an important object of the present invention to provide a floating gate type field effect transistor which is simple and free from deterioration of an insulating film beneath a floating gate electrode.

To accomplish the object, the present invention proposes to dope a floating gate electrode with p-type dopant impurity.

In accordance with the present invention, there is provided a floating gate type field effect transistor fabricated on a semiconductor substrate, comprising: a source region formed in a surface portion of the semiconductor substrate; a drain region formed in another surface portion of the semiconductor substrate, and spaced from the source region; a channel region located between the source region and the drain region; and a gate structure provided on the channel region, and having a first gate insulating layer covering the channel region, a floating gate electrode formed of p-type semiconductor material patterned on the first gate insulating layer, and accumulating electrons in an write-in operation, a second gate insulating layer covering the floating gate electrode, and a control gate electrode formed on the second gate insulating layer and applied with an erasing pulse signal in an erasing operation for drifting the electrons in a depletion layer produced in the floating gate electrode toward the first gate insulating layer, thereby evacuating parts of the electrons.

BRIEF DESCRIPTION OF THE DRAWINGS

The feature and advantages of the floating gate type field effect transistor according to the present invention will be more clearly understood from the following description taken in conjunction with the accompanying drawings in which.

DESCRIPTION OF THE PREFERRED EMBODIMENTS

First Embodiment

Figure 1:
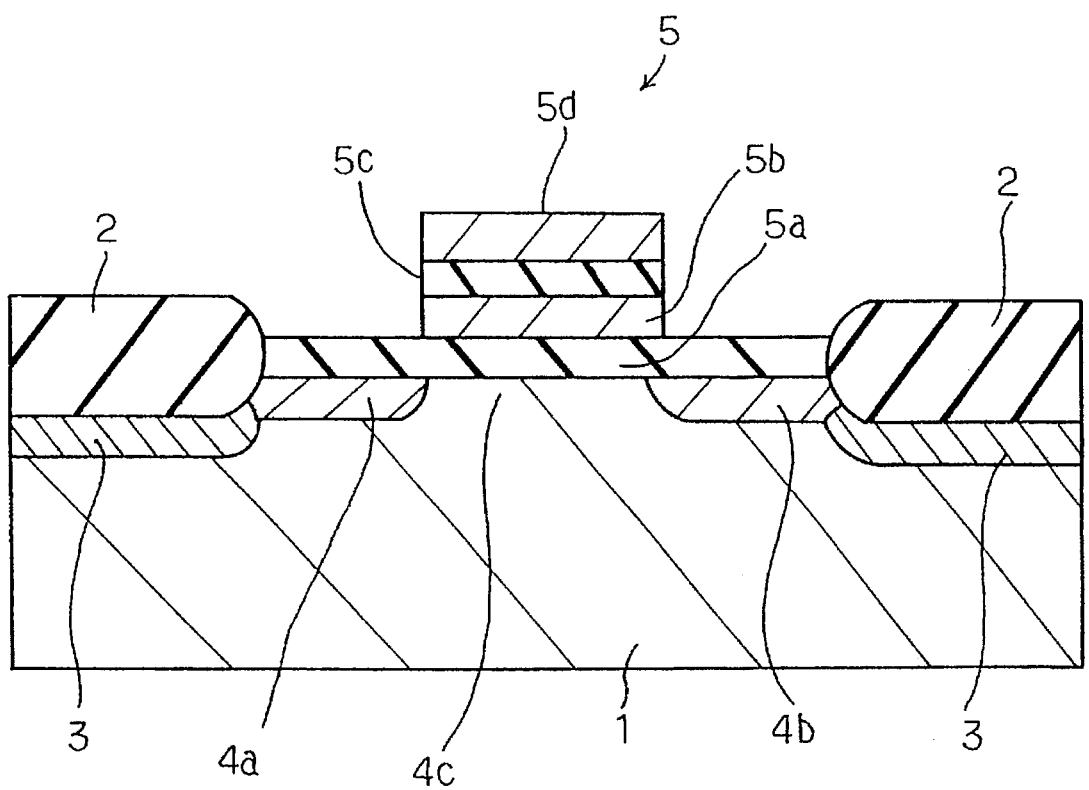
FIG. 1 is a cross sectional view showing the structure of the first prior art floating gate type field effect transistor.
Figure 2:
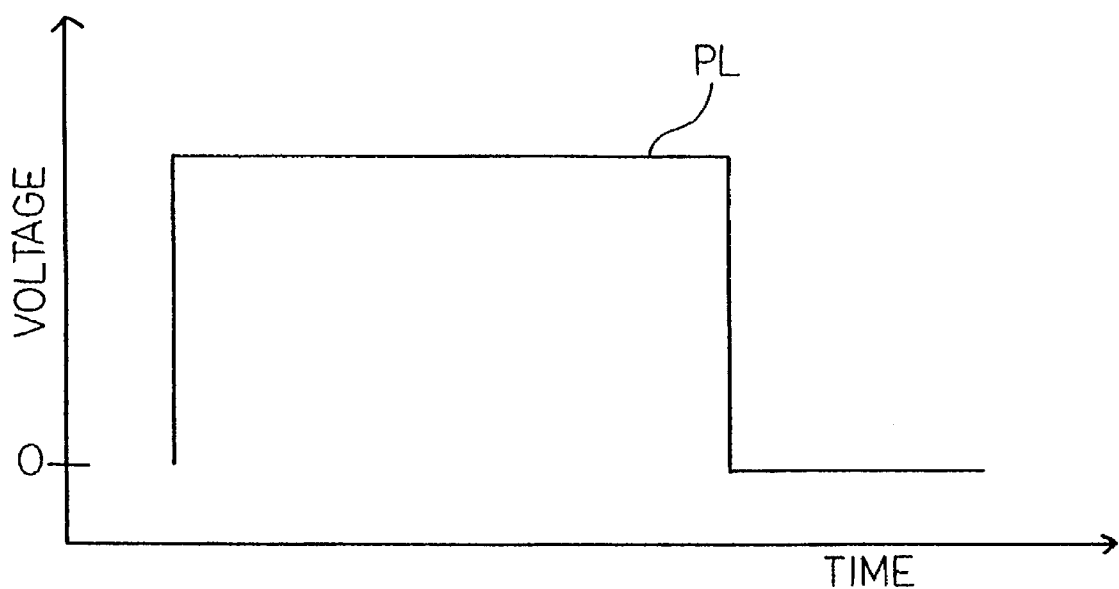
FIG. 2 is a graph showing the pulse applied to the control gate electrode of the first prior art floating gate type field effect transistor in the erasing operation.
Figure 3:
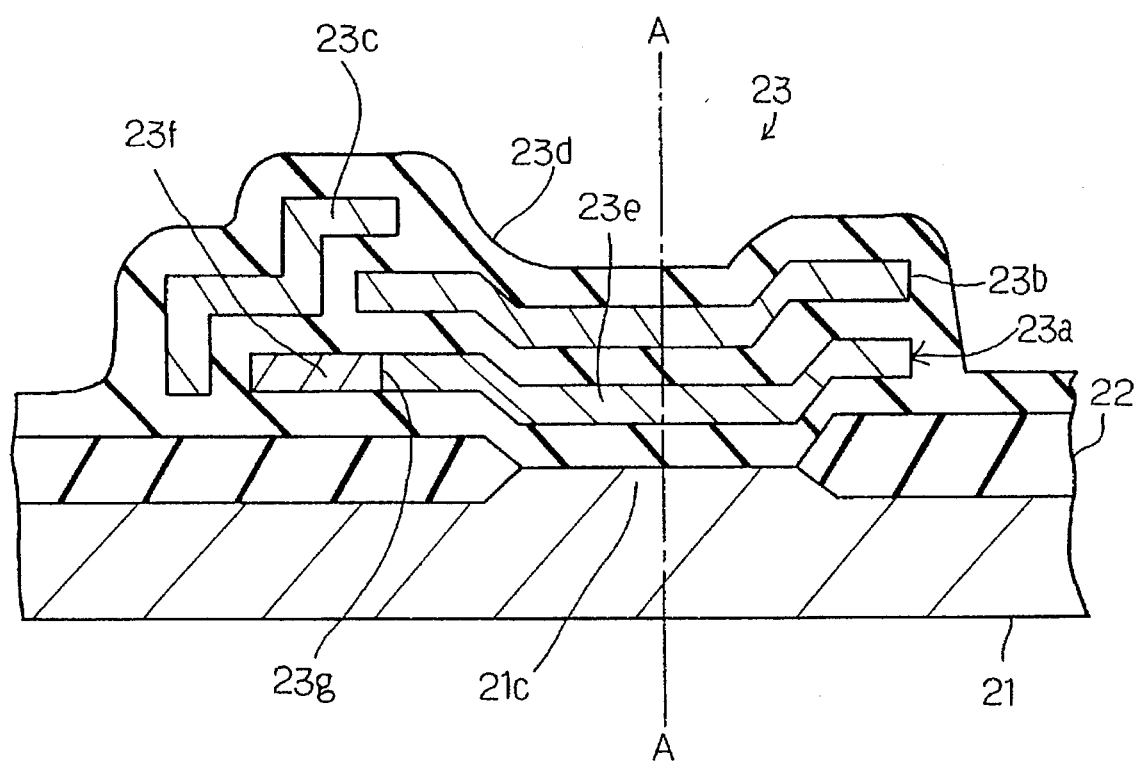
FIG. 3 is a cross sectional view showing the structure of the second prior art floating gate type field effect transistor.
Figure 4:
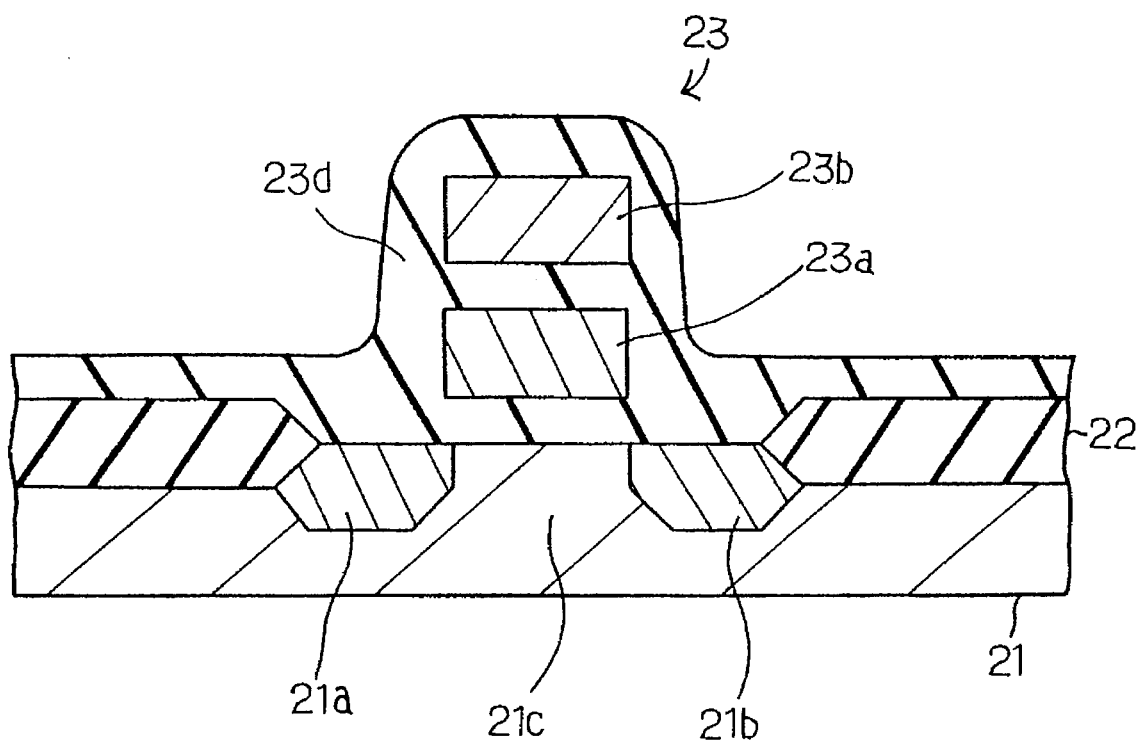
FIG. 4 is a cross sectional view taken along line A—A of FIG. 3.
Figure 5:
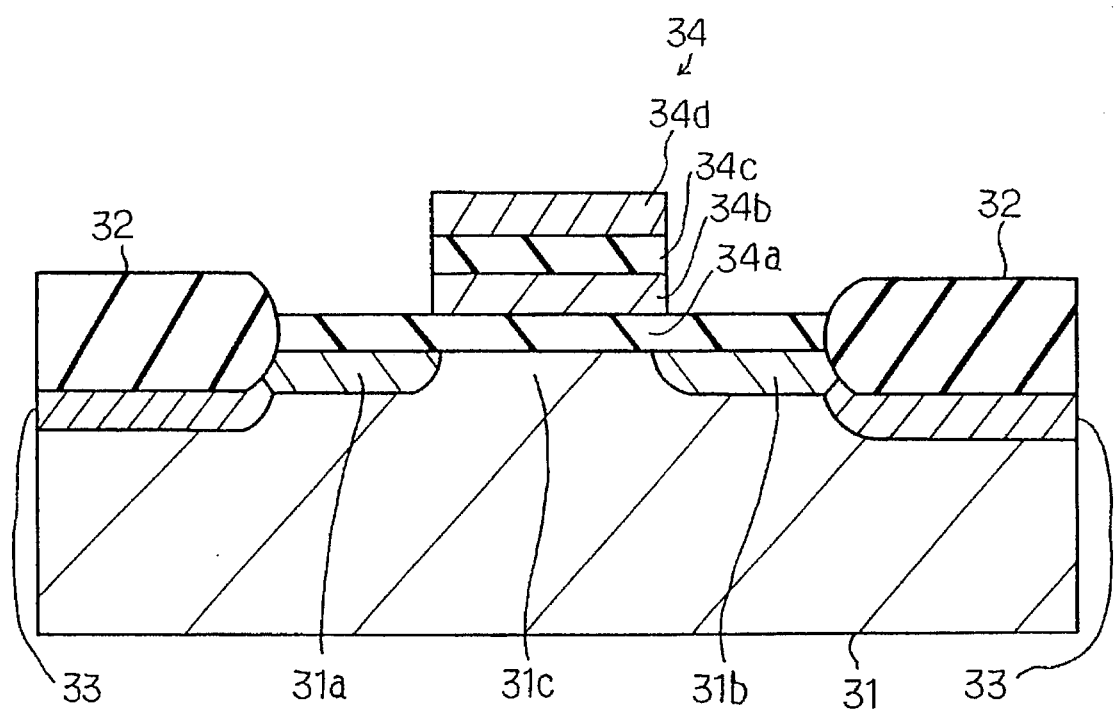
FIG. 5 is a cross sectional view showing the structure of a floating gate type field effect transistor according to the present invention.

Referring to FIG. 5 of the drawings, a floating gate type field effect transistor embodying the present invention is fabricated on a p-type silicon substrate 31, and a thick field oxide layer 32 defines an active region in a surface portion of the p-type silicon substrate 31. A heavily doped p-type channel stopper 33 is formed beneath the thick field oxide layer 32, and isolates the active region from adjacent active regions (not shown) together with the thick field oxide layer 32.

A heavily doped n-type source region 31a and a heavily doped n-type drain region 31b are formed in the active region, and are spaced from one another by a channel region 31c. A gate structure 34 is provided on the channel region 31c, and has a first gate insulating film 34a, a floating gate electrode 34b, a second gate insulating film 34c and a control gate electrode 34d.

Though not shown in FIG. 5, the gate structure 34 is wrapped in an inter-level insulating layer, and the control gate electrode 34 is connected to a variable voltage source.

In this instance, the first gate insulating film 34a and the second gate insulating film 34c are formed of silicon oxide. The floating gate electrode 34b is formed of p-type polysilicon, and the control gate electrode 34d is formed of n-type polysilicon.

The floating gate type field effect transistor is changed between the write-in state and the erased state as follows. The write-in operation is similar to that of the prior art floating gate type field effect transistor. Namely, hot electrons are attracted toward the floating gate electrode 34b in high electric field created in the first gate insulating film 34a, and are accumulated in the floating gate electrode 34b. The accumulated electrons decrease the majority carrier of the p-type polysilicon, i.e., holes, and increase the minority carrier, i.e., electrons. As a result, the floating gate electrode 34b is changed to a negative potential level, and changes the dopant level of the channel region 31c.

On the other hand, the floating gate type field effect transistor is changed to the erased state by evacuating the accumulated electrons to the p-type silicon substrate 31. Namely, a negative voltage level with respect to the p-type silicon substrate 31 is applied from the variable voltage source (not shown) to the control gate electrode 34d, and a depletion layer extends from the boundary between the first gate insulating layer 34a and the floating gate electrode 34b for hundreds milli-seconds upon application of the negative voltage level. The depletion layer consumes most of the potential difference between the control gate electrode 34d an the p-type silicon substrate 31, and only a small amount of electric stress is applied to the first gate insulating layer 34a. In other words, the depletion layer restricts the generation of the trapping centers.

The minority carrier or the electrons in the floating gate electrode 34b are drifted toward the first insulating layer 34a, and obtains high kinetic energy in the high electric field created in the depletion layer. The electrons thus accelerated impact against the silicon crystal, and generate electron-hole pairs. The electrons produced in the silicon crystal are also accelerated in the electric field, and further generate electron-hole pairs. The cumulative multiplication of electrons is referred to as avalanche, and the electrons cross the potential barrier of the first insulating layer 34a at a certain probability. The holes equal to the electrons crossing the potential barrier are left in the floating gate electrode 34b, and urge the floating gate electrode 34b to be neutral.

After the hundreds milli-second, the floating gate electrode 34b in the vicinity of the first insulating layer 34a is inverted, and the minority carrier or electrons are generated. As a result, the depletion layer is shrunk, and the avalanche process is terminated. This means that the number of electrons evacuating into the silicon substrate 31 is rapidly decreased. The potential difference is directly applied to the first insulating layer 34a, and the first insulating layer 34a is subjected to the electric stress. In order to prevent the first insulating layer 34a from the electric stress, the negative potential is removed from the control gate electrode 34d before the inversion, and is repeated at intervals. In other words, a negative pulse signal is applied to the control gate electrode 34d in the erasing operation, and is shorter than a time constant for the generation of the inverted layer. The time constant is determined on the basis of properties of the doped polysilicon such as the dopant concentration.

If the dopant concentration of the floating gate electrode 34b is high, the avalanche breakdown is effectively produced under a relatively low negative voltage applied to the control gate electrode 34d. For this reason, the dopant concentration of the floating gate electrode 34a is equal to or greater than $5 \times 10^{16}$ cm$^{-3}$, and the negative voltage is equal to or less than −20 volts on the assumption that the p-type silicon substrate 31 is grounded.

The present inventor evaluated the floating gate type field effect transistor according to the present invention. Using the pulse signal shown in FIG. 6, the floating gate type field effect transistor of the present invention was changed from the write-in state to the erased state, and the threshold was measured in both states. The pulse signal was continuously applied to the gate electrode 34d until most of the injected electrons were evaluated. The measured threshold was plotted in FIG. 7 as indicative by dots. In this evaluation, the pulse signal had the pulse width of the order of 10 microsecond. However, the undesirable inversion layer was not produced until the pulse width of the order of 100 millisecond.

Similarly, the first prior art floating gate type field effect transistor was changed between the write-in state and the erased state, and the threshold was measured. The measured threshold was also plotted in FIG. 7 as indicative by small triangle.

Comparing the dots with the small triangle, although the threshold of the first prior art floating gate type field effect transistor tends to converge, but the floating gate type field effect transistor of the present invention keeps the threshold. Therefore, it is understood that the first insulating layer 34a is less deteriorated through the erasing operation.

As will be understood from the foregoing description, the floating gate electrode 34b of the p-type polysilicon is effective against the electric stress, and prolongs the service time period of the floating gate type field effect transistor. The floating gate type field effect transistor according to the present invention does not require a p-n junction in the floating gate electrode and a second control electrode, and, for this reason, the structure is simpler than the second prior art floating gate type field effect transistor.

Figure 8A:
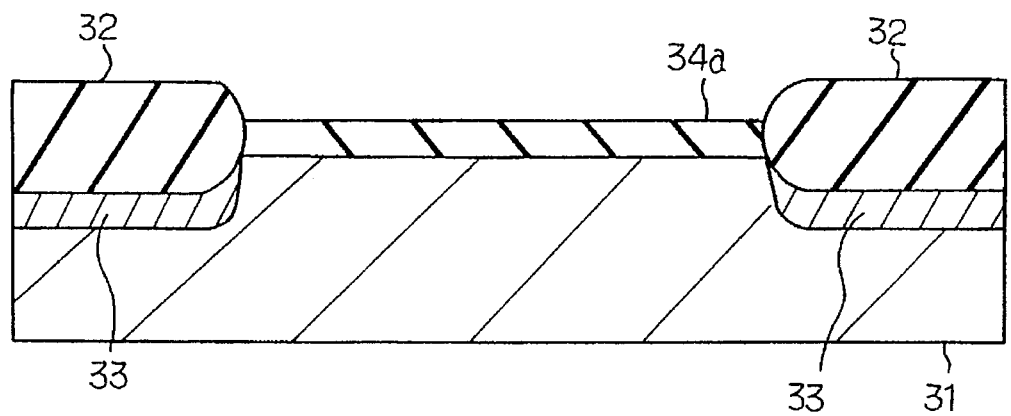
FIGS. 8A to 8D are cross sectional views showing a process sequence for fabricating the floating gate type field effect transistor according to the present invention.

Description is hereinbelow made on a process sequence for fabricating the floating gate type field effect transistor according to the present invention with reference to FIGS. 8A to 8D. The process sequence starts with preparation of the p-type silicon substrate 31. P-type dopant impurity is selectively ion implanted into the p-type silicon substrate 31, and the thick field oxide layer 32 is selectively grown on the p-type silicon substrate 31. While the thick field oxide layer 32 is being grown, the p-type dopant impurity forms the channel stopper 33. The active region is exposed by removing an oxide film, and the first gate insulating layer 34a is thermally grown to 10 nanometers on the active region. The resultant structure is illustrated in FIG. 8A.

Figure 8B:
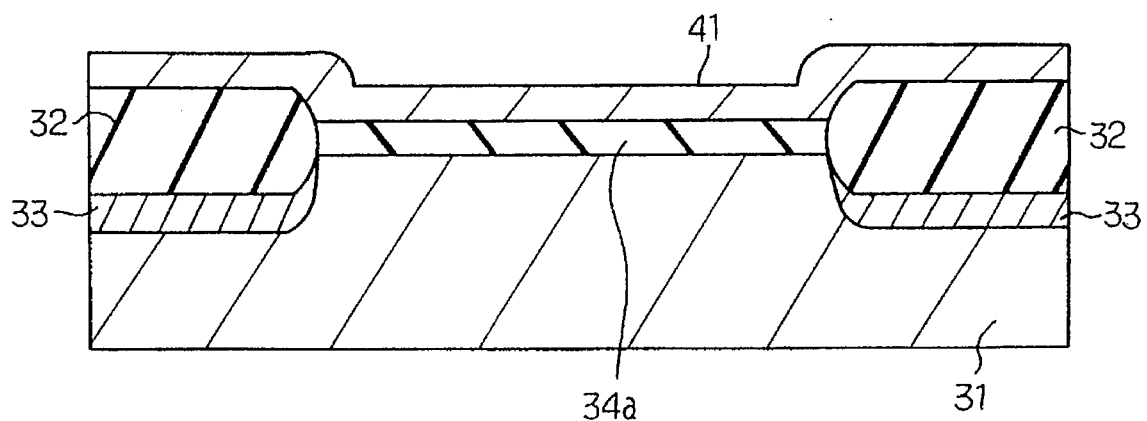

Polysilicon is deposited over the entire surface of the structure to 600 nanometers by using a chemical vapor deposition, and boron is ion implanted into the polysilicon layer 41. The dose and accelerating energy are regulated in such a manner that the boron concentration is not less than $5 \times 10^{16}$ cm$^{-3}$ upon completion of the fabrication process. The resultant structure is illustrated in FIG. 8B.

Silicon oxide is deposited to 20 nanometers over the doped polysilicon layer 41, and the doped polysilicon layer is overlain by the silicon oxide layer 42. Subsequently, polysilicon is deposited to 400 nanometers over the silicon oxide layer 42, and the silicon oxide layer 42 is overlain by the polysilicon layer 43. The resultant structure is placed in phosphorus oxychloride atmosphere, and is heated therein. Then, the polysilicon layer 43 becomes n-type conductivity type, and the boron implanted into the polysilicon layer 41 is activated.

Figure 8C:
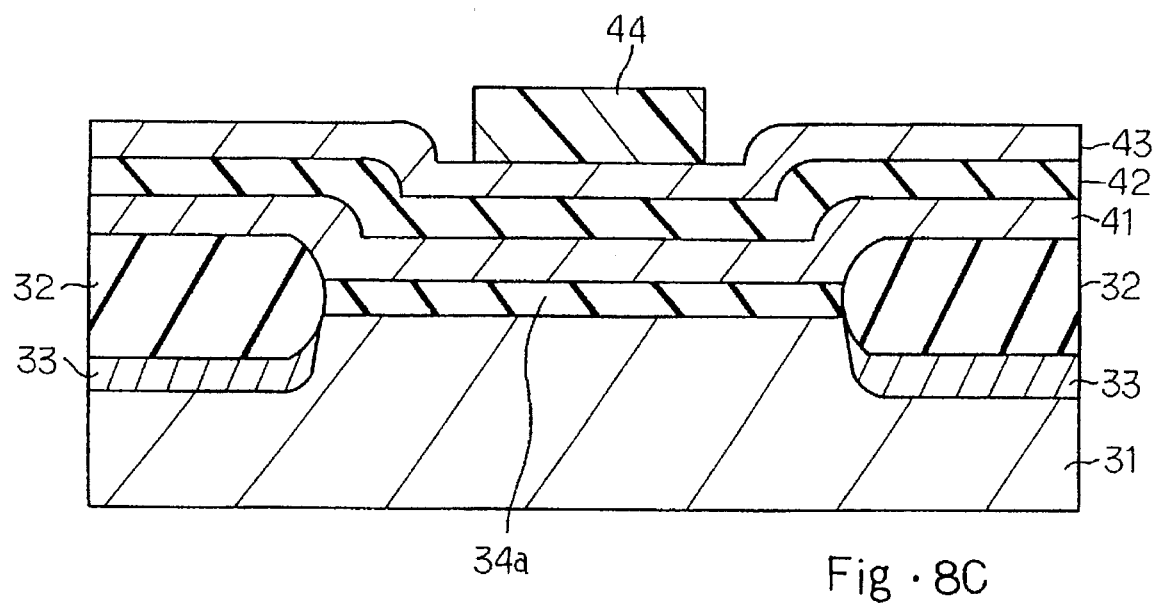
Figure 8D:
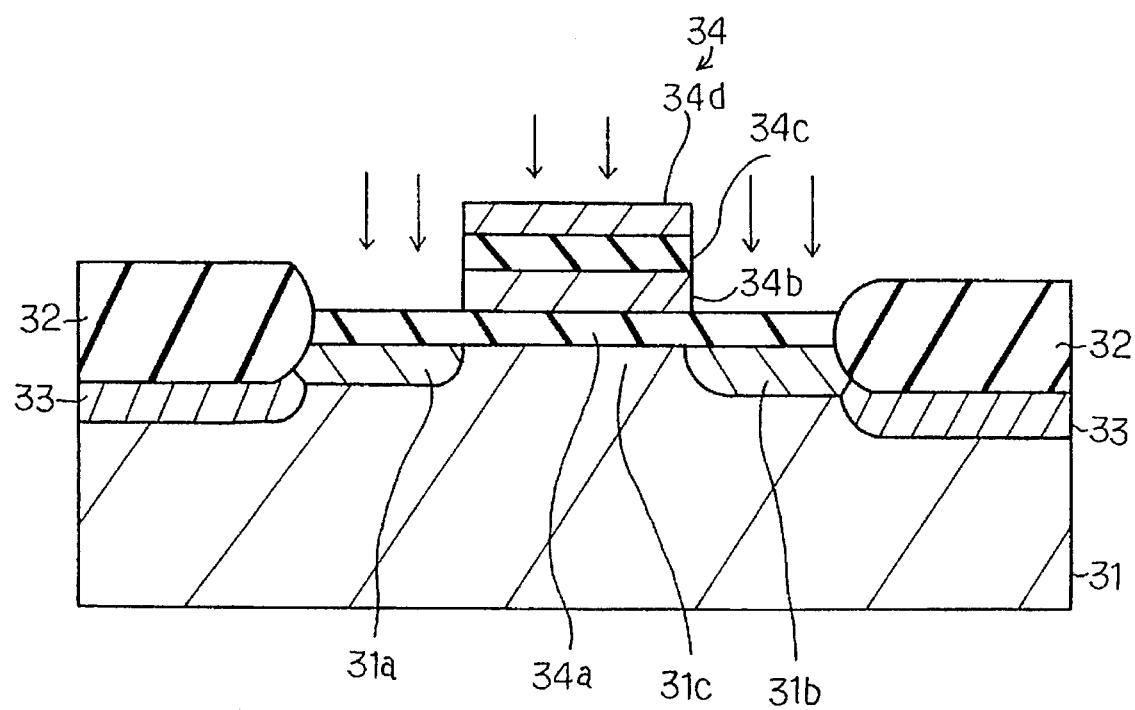

Photo-resist solution is spun onto the polysilicon layer 43, and a mask layer 44 is patterned through a lithographic process as shown in FIG. 8C.

Using the mask 44, the polysilicon layer 43, the silicon oxide layer 42 and the polysilicon layer 41 are partially etched away, and the floating gate electrode 34b, the second insulating layer 34c and the control gate electrode 34d are formed on the first insulating layer 34a.

The mask 44 is stripped off, and n-type dopant impurity such as arsenic or phosphorous is ion implanted into the active region in a self-aligned manner with the gate structure 34. Then, the n-type source region 31a and the heavily-doped n-type drain region 31b are formed in the active region on both side of the channel region 31c. Finally, the resultant structure is placed in nitrogen atmosphere, and is heated for activating the n-type dopant impurity.

Thus, the fabrication process is simple, because a p-n junction of the floating gate electrode and a second control gate are not necessary for the floating gate type field effect transistor according to the present invention.

Second Embodiment

Figure 9:
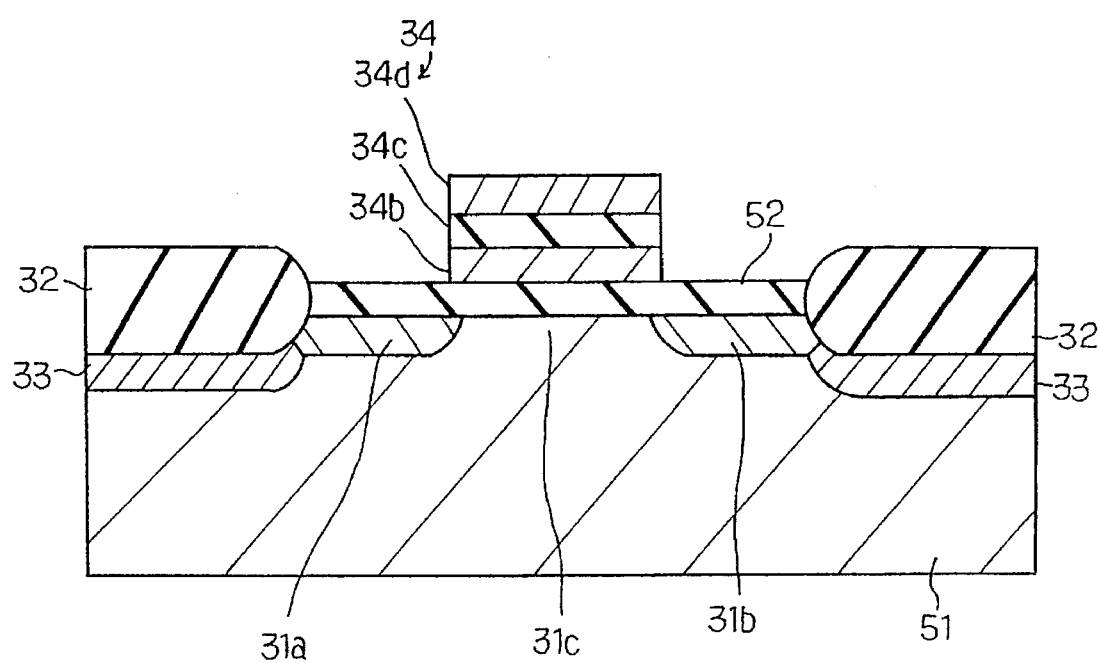
FIG. 9 is a cross sectional view showing the structure of another floating gate type field effect transistor according to the present invention.

Turning to FIG. 9 of the drawings, another floating gate type field effect transistor is fabricated on a p-type silicon substrate 51. The floating gate type field effect transistor shown in FIG. 9 is similar to the floating gate type field effect transistor shown in FIG. 5 except for a first insulating layer 52. For this reason, layers and regions of the floating gate type field effect transistor shown in FIG. 9 are labeled with the same references designating the corresponding layers and regions of the first embodiment without detailed description.

The first insulating layer 52 is formed of silicon nitride, and is effective against undesirable diffusion of the boron from the floating gate electrode 34b into the channel region 31c. Therefore, the channel doping level of the second embodiment is stable rather than the first embodiment.

The first insulating layer of silicon nitride is formed as follows. First, the exposed active region is thermally oxidized for growing a silicon oxide to 8 nanometers, and the silicon oxide is heated to 1000 degrees in centigrade in ammonia atmosphere by suing a lamp heater, thereafter heating in a dry oxygen to 1050 degrees in centigrade by using the lamp heater.

The floating gate type field effect transistor implementing the second embodiment achieves all the advantages of the first embodiment.

Third Embodiment

Figure 10:
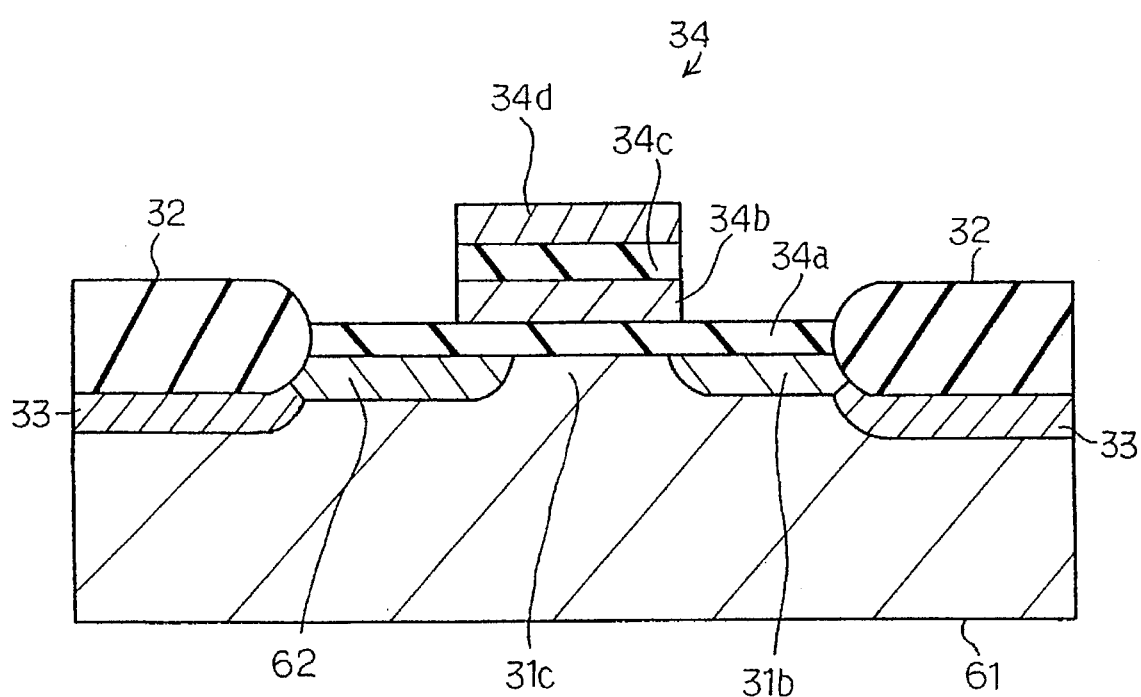
FIG. 10 is a cross sectional view showing the structure of yet another floating gate type field effect transistor according to the present invention.

Turning to FIG. 10 of the drawings, yet another floating gate type field effect transistor embodying the present invention is fabricated on a p-type silicon substrate 61. The floating gate type field effect transistor shown in FIG. 10 is similar to the floating gate type field effect transistor shown in FIG. 5 except for a heavily doped source region 62. For this reason, layers and regions of the floating gate type field effect transistor shown in FIG. 10 are labeled with the same references designating the corresponding layers and regions of the first embodiment without detailed description.

Figure 6:
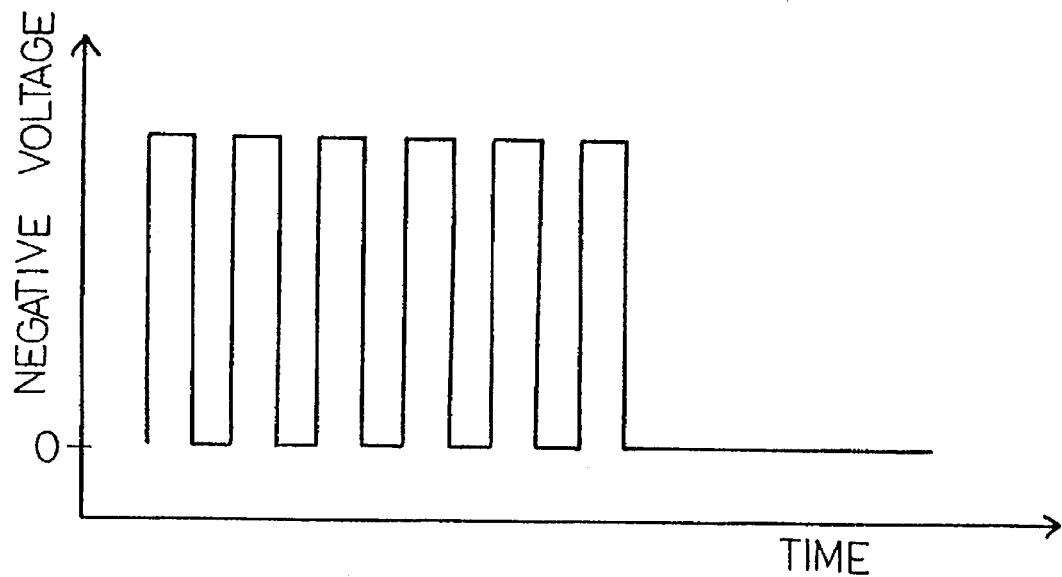
FIG. 6 is a graph showing the waveform of a pulse signal applied to a control gate electrode of the floating gate type field effect transistor in an erasing operation.
Figure 7:
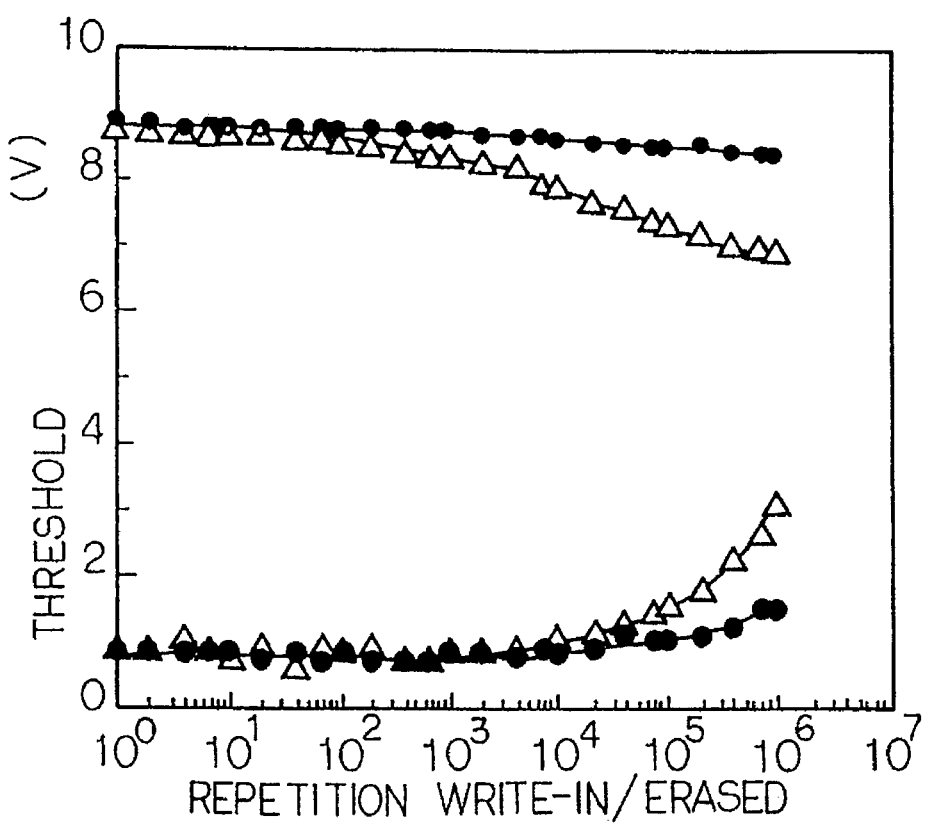
FIG. 7 is a graph showing variation of the threshold between the floating gate type field effect transistor according to the present invention and the first prior art floating gate type field effect transistor.

The heavily doped n-type source region 62 is partially overlapped with the gate structure 34, and the control gate electrode 34d is negatively biased with respect to the heavily doped n-type source region 62. As a result, electrons are evacuated to the heavily doped n-type source region in the erasing operation. The pulse signal shown in FIG. 6 is available for the erasing operation on the floating gate type field effect transistor shown in FIG. 10.

As will be appreciated from the foregoing description, the floating gate type field effect transistor according to the present invention is equipped with a floating gate electrode formed of p-type semiconductor material, and the p-type semiconductor material allows the bias between the control gate electrode and the substrate or the source region to drift accumulated electrons in the depletion layer for evacuating the electrons thereinto. Most of the bias voltage is consumed by the depletion layer, and only negligible electric stress is applied to the first insulating layer. As a result, the first insulating layer is not deteriorated, and the floating gate type field effect transistor serves as a memory cell for long time.

Although particular embodiments of the present invention have been shown and described, it will be obvious to those skilled in the art that various changes and modifications may be made without departing from the spirit and scope of the present invention. For example, if the p-type silicon substrate is biased to a positive voltage level, an erasing pulse signal may be changed between the ground voltage level and the positive voltage level.

What is claimed is:

1. A floating gate type field effect transistor fabricated on a semiconductor substrate, comprising:

a source region formed in a surface portion of said semiconductor substrate;

a drain region formed in another surface portion of said semiconductor substrate, and spaced from said source region;

a channel region located between said source region and said drain region;

a gate structure provided on said channel region, and having a first gate insulating layer covering said channel region, a floating gate electrode formed of p-type semiconductor material patterned on said first gate insulating layer, and accumulating electrons in a write-in operation, a second gate insulating layer covering said floating gate electrode, and a control gate electrode formed on said second gate insulating layer; and means for connecting said control gate electrode to a variable voltage source for generating a negative erasing pulse signal applied to said control gate electrode in an erasing operation, said negative erasing pulse signal causing said electrons to drift in a depletion layer produced in said floating gate electrode toward said first gate insulating layer, so as to exceed a potential gap between said floating gate electrode and said first gate insulating layer, thereby evacuating said electrons and preventing said first gate insulating layer from being damaged due to Fowler-Nordheim tunneling current.

2. The floating gate type field effect transistor as set forth in claim 1, in which said p-type semiconductor material is polysilicon doped with p-type dopant impurity.

3. The floating gate type field effect transistor as set forth in claim 1, in which said first gate insulating layer is formed of silicon oxide.

4. The floating gate type field effect transistor as set forth in claim 1, in which said first gate insulating layer is formed of silicon nitride.

5. The floating gate type field effect transistor as set forth in claim 1, in which said electrons are evacuated to said semiconductor substrate.

6. The floating gate type field effect transistor as set forth in claim 1, in which said source region is partially overlapped with said gate structure for evacuating said electrons to said source region.

7. A transistor according to claim 1, and further comprising, a pulse signal source adapted to apply said erasing pulse signal to said control gate electrode.

8. A floating gate type field effect transistor fabricated on a semiconductor substrate, comprising:

a source region formed in a surface portion of said semiconductor substrate;

a drain region formed in another surface portion of said semiconductor substrate, and spaced from said source region;

a channel region located between said source region and said drain region;

a gate structure provided on said channel region, and having a first gate insulating layer covering said channel region, a floating gate electrode formed of p-type polysilicon doped with p-type dopant impurity, patterned on said first gate insulating layer and accumulating electrons in a write-in operation, a concentration of said p-type dopant impurity being equal to or greater than $5 \times 10^{16}$ cm$^{-3}$ so as to produce an avalanche breakdown, a second gate insulating layer covering said floating gate electrode, and a control gate electrode formed on said second gate insulating layer; and means for connecting said control gate electrode to a variable voltage source for generating a negative erasing pulse signal applied to said control gate electrode in an erasing operation, said negative erasing pulse signal causing said electrons to drift in a depletion layer produced in said floating gate electrode toward said first gate insulating layer, so as to exceed a potential gap between said floating gate electrode and said first gate insulating layer, thereby evacuating said electrons and preventing said first gate insulating layer from being damaged due to Fowler-Nordheim tunneling current.

9. A floating gate type field effect transistor fabricated on a p-type silicon substrate, comprising:

a heavily doped n-type source region formed in a surface portion of said p-type silicon substrate;

a heavily doped n-type drain region formed in another surface portion of said p-type silicon substrate, and spaced from said heavily doped n-type source region;

a channel region located between said source region and said drain region;

a gate structure provided on said channel region, and having a first gate insulating layer of silicon oxide covering said channel region, a floating gate electrode formed of p-type polysilicon patterned on said first gate insulating layer, and accumulating electrons in a write-in operation, a second gate insulating layer of silicon oxide covering said floating gate electrode, and a control gate electrode formed of n-type polysilicon patterned on said second gate insulating layer; and means for connecting said control gate electrode to a variable voltage source for generating a negative erasing pulse signal applied to said control gate electrode in an erasing operation, said negative erasing pulse signal causing said electrons to drift in a depletion layer produced in said floating gate electrode toward said first gate insulating layer, so as to exceed a potential gap between said floating gate electrode and said first gate insulating layer, thereby evacuating said electrons into said p-type silicon substrate and preventing said first gate insulating layer from being damaged due to Fowler-Nordheim tunneling current.

10. A transistor according to claim 9, and further comprising, a pulse signal source adapted to apply said erasing pulse signal to said control gate electrode.

11. A floating gate type field effect transistor fabricated on a p-type silicon substrate, comprising:

a heavily doped n-type source region formed in a surface portion of said p-type silicon substrate;

a heavily doped n-type drain region formed in another surface portion of said p-type silicon substrate, and spaced from said heavily doped n-type source region;

a channel region located between said source region and said drain region;

a gate structure provided on said channel region, and having a first gate insulating layer of silicon nitride covering said channel region, a floating gate electrode formed of p-type polysilicon patterned on said first gate insulating layer, and accumulating electrons in a write-in operation, a second gate insulating layer of silicon oxide covering said floating gate electrode, and a control gate electrode formed of n-type polysilicon patterned on said second gate insulating layer; and means for connecting said control gate electrode to a variable voltage source for generating a negative erasing pulse signal applied to said control gate electrode in an erasing operation, said negative erasing pulse signal causing said electrons to drift in a depletion layer produced in said floating gate electrode toward said first gate insulating layer, so as to exceed a potential gap between said floating gate electrode and said first gate insulating layer, thereby evacuating said electrons into said p-type silicon substrate and preventing said first gate insulating layer from being damaged due to Fowler-Nordheim tunneling current.

12. A transistor according to claim 11, and further comprising, a pulse signal source adapted to apply said erasing pulse signal to said control gate electrode.

13. A floating gate type field effect transistor fabricated on a p-type silicon substrate, comprising:

a heavily doped n-type source region formed in a surface portion of said p-type silicon substrate;

a heavily doped n-type drain region formed in another surface portion of said p-type silicon substrate, and spaced from said heavily doped n-type source region;

a channel region located between said source region and said drain region;

a gate structure provided on said channel region, and partially overlapping said heavily-doped n-type source region, said gate structure having a first gate insulating layer of silicon oxide covering said channel region, a floating gate electrode formed of p-type polysilicon patterned on said first gate insulating layer, and accumulating electrons in a write-in operation, a second gate insulating layer of silicon oxide covering said floating gate electrode, and a control gate electrode formed of n-type polysilicon patterned on said second gate insulating layer; and means for connecting said control gate electrode to a variable voltage source for generating a negative erasing pulse signal applied to said control gate electrode in an erasing operation, said negative erasing pulse signal causing said electrons to drift in a depletion layer produced in said floating gate electrode toward said first gate insulating layer, so as to exceed a potential gap between said floating gate electrode and said first gate insulating layer, thereby evacuating said electrons into said heavily doped p-type source region and preventing said first gate insulating layer from being damaged due to Fowler-Nordheim tunneling current.

14. A transistor according to claim 13, and further comprising, a pulse signal source adapted to apply said erasing pulse signal to said control gate electrode.

* * * * *